(12) United States Patent
Liu et al.

(10) Patent No.: US 6,265,752 B1
(45) Date of Patent: Jul. 24, 2001

(54) METHOD OF FORMING A HVNMOS WITH AN N+ BURIED LAYER COMBINED WITH N WELL AND A STRUCTURE OF THE SAME

(75) Inventors: Kou-Chio Liu, Kaohsiung; Jyh-Min Jiang, Hsinchu Hsien; Chen-Bau Wu, Tu Chen; Ruey-Hsin Liou, Hsinchu, all of (TW)

(73) Assignee: Taiwan Semiconductor Manufacturing, Co., Inc., Hsinchu (TW)

( * ) Notice: Subject to any disclaimer, the term of this patent is extended or adjusted under 35 U.S.C. 154(b) by 0 days.

(21) Appl. No.: 09/318,119

(22) Filed: May 25, 1999

(51) Int. Cl.$^7$ ............................................. H01L 23/58
(52) U.S. Cl. .............................. 257/487; 257/370; 257/34
(58) Field of Search ........................... 257/487, 502, 257/370, 34, 43; 438/202–205, 309

(56) References Cited

U.S. PATENT DOCUMENTS

| | | | |
|---|---|---|---|
| 4,047,217 | * 9/1977 | McCaffrey | 357/34 |
| 4,862,242 | * 8/1989 | Wildi | 357/48 |
| 5,017,996 | * 5/1991 | Yasuoka | 357/43 |
| 5,070,381 | * 12/1991 | Scott | 357/35 |
| 5,087,954 | * 2/1992 | Shirai | 357/41 |
| 5,105,252 | * 4/1992 | Kim | 357/43 |
| 5,227,654 | * 7/1993 | Momose | 257/370 |
| 5,242,854 | * 9/1993 | Solheim | 437/69 |
| 5,311,054 | * 5/1994 | DeJong | 257/565 |

FOREIGN PATENT DOCUMENTS

2193036-A * 1/1988 (EP).

* cited by examiner

Primary Examiner—Olik Chaudhuri
Assistant Examiner—Nathan W. Ha
(74) Attorney, Agent, or Firm—Nath & Associates PLLC; Harold L. Novick; Marvin C. Berkowitz

(57) ABSTRACT

The device includes a N$^+$ buried layer in a substrate. A P-well is formed in an epitaxial layer on the buried layer. N-wells surround the P-well are also formed in the epitaxial layer. One of the N-well regions acts as a drain in the structure. A plurality of field oxide regions is formed on the N-well or P-well to define the active area of the device. A gate oxide is formed on the surface of the P-well and the N-well served as the drain. A gate is formed on the gate oxide. Drain contact is formed in the N-well for drain. The source region of the device is formed in the P-well adjacent to the drain. An isolation layer is deposited on the gate. The method includes forming a N$^+$ buried layer in a P substrate. A P epitaxial layer is then formed on the surface of the P substrate. The N-well and P-well are respectively formed in the epitaxial layer by ion implantation and thermally diffusion. A plurality of field oxide (FOX) regions are created to define the active area. A gate structure is patterned on the N-well and P-well. A drain contact in the drain (N-well) and a source region in the P-well over the N$^+$ buried layer are formed by conventional manner. An isolation layer is patterned on the gate structure for isolation.

7 Claims, 3 Drawing Sheets

METHOD OF FORMING A HVNMOS WITH AN N+ BURIED LAYER COMBINED WITH N WELL AND A STRUCTURE OF THE SAME

FIELD OF THE INVENTION

The present invention relates to semiconductor devices, and more specifically, to a high voltage NMOS with an n+ buried layer combined with N well.

BACKGROUND

For ultra large scale integrated (ULSI) circuits application, one of the features is to shrink the dimensions of devices down to sub-micron or deep sub-micron range. In NMOS, a channel region in the semiconductor under the gate is doped with ions that are opposite to that of the source and drain. The operation of the MOS includes the application of applying a voltage to the gate. By varying the transverse electrical field, it is possible to control the current flow by modulating the longitudinal conductance of the channel. If the drain bias is applied such that source-body and drain-body junctions remain reverse-bias. A positive bias is applied to the gate of the NMOS, electrons will be attracted to the channel region, once enough electrons are drawn into the channel region by the positive gate voltage, the channel connects the source and the drain.

One type of the NMOS is called a high voltage NMOS (HVNMOS), which can be operated under applying a high operation voltage. FIG. 1 shows a prior art high voltage NMOS (HVNMOS). A P-well and an N-well are respectively formed on a P type dopant epitaxial silicon layer formed on a wafer or substrate. The N-well region plays the role of drain in the structure. Field oxide regions 2 are formed on the N-well to reduce the electric field near the drain. A gate oxide 4 is formed on the surface of the both wells and adjacent to the field oxide 2. A gate 6, typically composed of polysilicon, is formed on the gate oxide. A drain contact 8 is formed in the N-well by doping impurities into a desired region of the well. In general, the dopant concentration of the drain contact 8 is higher than that of the N-well. The source 10 is formed in the P-well adjacent to the gate, typically the source 10 is created by conventional ion implantation. An isolation layer 12 is deposited on the gate 6 and a portion of the dual well to expose a portion of the source 10 and the drain 8. The channel region of the HVNMOS is located within the P-well under the gate oxide 4.

The MOS is a four-terminal device, a contact can also be made to the body region. A bias can also be applied between the source and body and such a bias will have an impact on threshold voltage (Vt). The impact of the source-body bias on Vt is referred to the body effect. Unfortunately, in the structure of the aforesaid HVNMOS, the P-well is directly short circuit to the P-substrate. Thus, the aforementioned HVNMOS suffers the issue of the body effect arisen by the P-substrate short to the source. Further, the device can not allow negative voltage operation.

What is needed in the art is a method to form a HVMOS in an epitaxial layer and semiconductor substrate which has a high breakdown voltage and to eliminate the body effect induced by the P-substrate.

SUMMARY

An object of the present invention is to provide a structure of a HVNMOS and the method of the same.

Another object of the present invention is to form a HVNMOS with an N+ buried layer combined with N-well to solate the P-well, thereby eliminating the body effect.

A further object of the present invention is to provide a HVNMOS that can be operated in negative voltage operation.

In accordance with the present invention, a HVNMOS is provided. The device includes a $N^+$ buried layer in a substrate. A P-well is formed with P type dopant in an epitaxial layer on the buried layer. N-wells surround the P-well and the N-wells are also formed in the epitaxial layer. The P-well is isolated by the N-well adjacent to the P-well and the $N^+$ buried layer. One of the N-well regions acts the drain in the structure. A plurality of field oxide regions is formed on the N-well or P-well to define the active area of the device. A gate oxide is formed on the surface of the P-well and the N-well served as the drain. A gate is formed on the gate oxide. A drain contact is formed in the N-well for drain by doping impurities into a desired region of the well. In a preferred embodiment, the concentration of the dopant is higher than that of the N-well for drain. The source region of the device is referred to a bulk pick-up source, which is consisted of a P type doped region adjacent to a N type doped region. Both of the P and N type doped region are formed in the P-well adjacent to the drain. An isolation layer is deposited on the gate and a portion of the P-well and N-well for drain. The channel region of the HVNMOS is located within the P-well under the gate oxide.

The method according to the present invention includes providing a single crystal P substrate with an $N^+$ buried layer formed therein. P epitaxial layer is then formed on the surface of the P substrate. The N-well and P-well are respectively formed in the epitaxial layer by ion implantation and thermally diffusion. The P-well is isolated by the N-wells and the $N^+$ buried layer. A plurality of isolation structure such as field oxide (FOX) regions are created for the purposes of defining the active area. Typically, the FOX regions are created via a conventional method.

Subsequently, a thin oxide layer is formed on the epitaxial layer to act as a gate dielectric. A doped polysilicon layers is deposited by chemical vapor deposition on the gate oxide layer. Then, the doped polysilicon layer and the gate dielectric layer are patterned to form gate structures on the P-well and N-well. An $N^+$ drain contact in the drain (N-well) and a source region in the P-well over the $N^+$ buried layer are formed by conventional manner. The source region of the device is consisted of a P type doped region and an N type doped region. The P type doped region is adjacent to the N type doped region. An isolation layer is patterned on the gate structure for isolation.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

The present invention proposes a novel method and a novel structure to fabricate a high voltage NMOS (HVNMOS) transistor by introducing an N+ buried layer that is combined with N-well to eliminate the impact of the body effect on threshold voltage. The N+ buried layer connected with the N-well is used as HVNMOS drain, and the P-well is isolated by the N-well and the N+ buried layer. Under this structure, the device can be operated by negative voltage operation. The detailed description can be seen as follows and in conjunction with the accompanying drawings.

Figure 5:
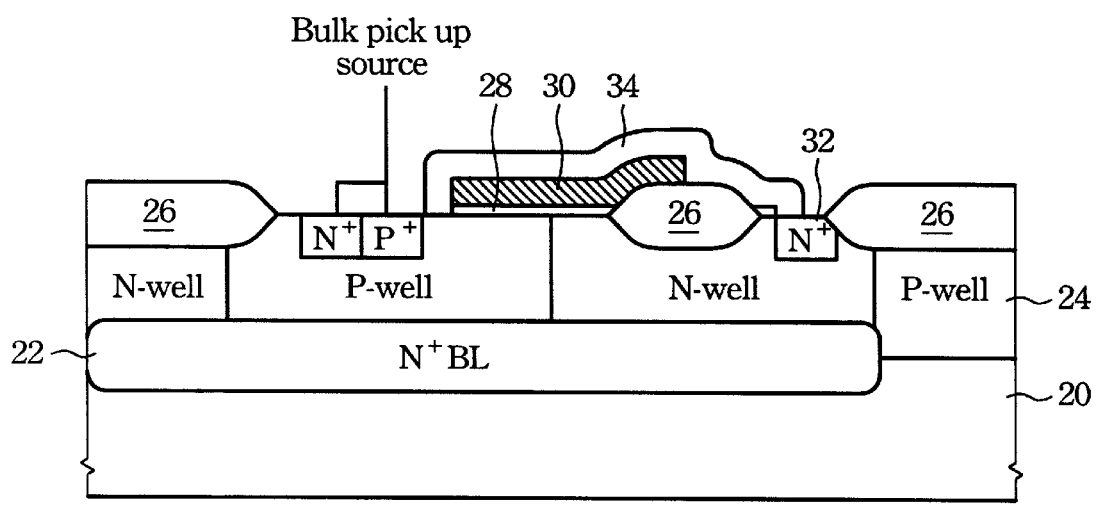
FIG. 5 is a cross sectional view of a semiconductor substrate illustrating the steps of forming source and drain according to the present invention.

The high voltage NMOS (HVNMOS) in accordance with the present invention is depicted in FIG. 5. A buried layer 22 is formed in a substrate or wafer 20 to have a depth from a surface of N-well or P-well. Preferably, the buried layer is doped with N+ type conductive dopants. The concentration of the dopants of the N+ buried layer 22 is about 10E19 to 10E20 atoms/cm$^3$. An epitaxial layer 24 with p conductive type ions (P-epi) is formed on the N+ buried layer (N+BL) 22 and a portion of the substrate 20. A P-well is formed with P type dopant in the epitaxial layer 24 on a portion of the buried layer 22. N-wells surround the P-well and the N-wells are also formed in the epitaxial layer 24. Therefore, the P-well is isolated by the N-well adjacent to the P-well and the N+ buried layer 22.

One of the N-well regions acts as a drain in the structure. The aforementioned N+ buried layer 22 with N+ conductive type ions connected to the N-well are also served as the drain. A plurality of field oxide regions 26 is formed on the N-well and P-well to define the active area of the device. A gate oxide 28 is formed on the surface of the P-well and the N-well served as the drain, the gate oxide 28 is also adjacent to the field oxide 26 on the drain region. A gate 30, preferably composed of polysilicon, is formed on the gate oxide 28. A drain contact 32 is formed in the N-well for drain by doping impurities into a desired region of the well. In a preferred embodiment, the concentration of the dopant is higher than that of the N-well acted as the drain. A portion of the gate 30 lies on a portion of the field oxide 26. The field oxide 26 enlarges the isolation thickness on the drain to reduce the electric field near the drain.

The source region of the device is referred to a bulk pick-up source, which is consisted of a P type doped region adjacent to a N type doped region. Both of the P and N type doped regions are formed in the P-well adjacent to the drain. The source region keeps a distance to a surface of the N+ buried layer 22. The punch-through breakdown voltage is related to the voltage between the substrate and source (Vss), therefore, the distance between the source region to the buried layer is corespondent to the voltage of break-down. The source region is formed by performing ion implantation to implant ion specie into the P-well, respectively. An isolation layer 34 is deposited on the gate and a portion of the P-well and N-well for drain to expose a portion of the source region and the drain. The channel region of the HVNMOS is located within the P-well under the gate oxide 28.

The source region of the HVNMOS is fully isolated by the surrounding N-well and the N+ conductive type buried layer 22, thereby eliminating the body effect induced by the short circuit of the P-well and P substrate. The method of forming the device can be seen as follows.

Figure 1:
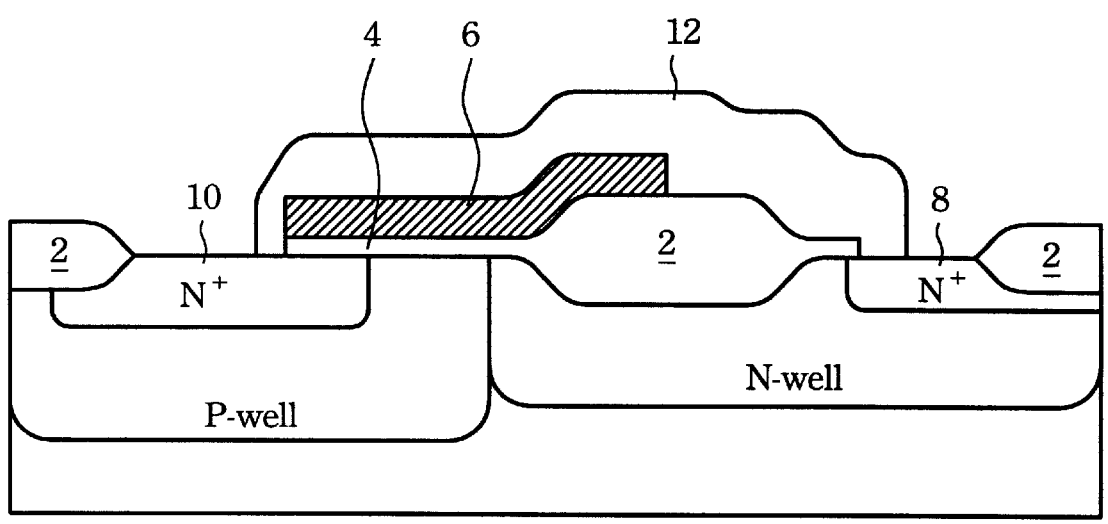
FIG. 1 is a cross sectional view of a semiconductor substrate illustrating the structure of a HVNMOS according to the prior art.
Figure 2:
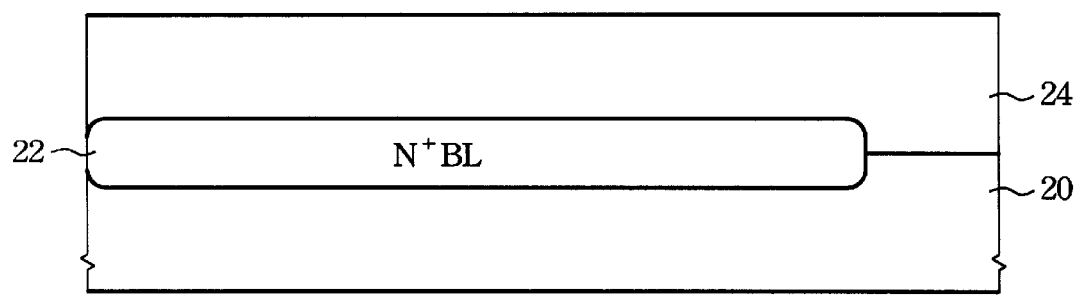
FIG. 2 is a cross sectional view of a semiconductor substrate illustrating the steps of forming a buried layer and an epitaxial layer on a semiconductor substrate according to the present invention.
Figure 3:
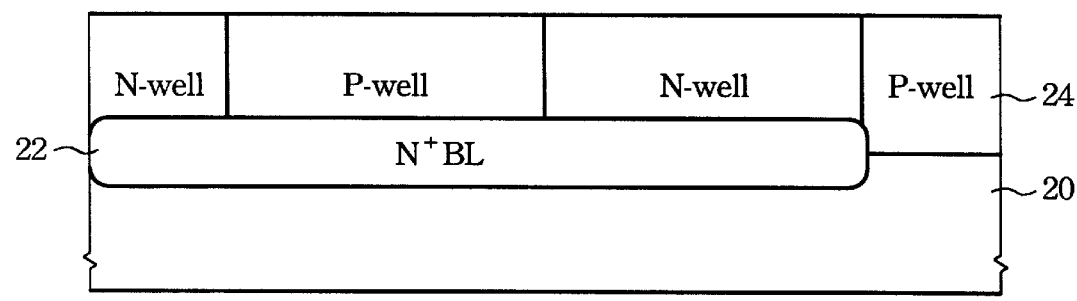
FIG. 3 is a cross sectional view of a semiconductor substrate illustrating the step of forming N-well and P-well according to the present invention.

Referring to FIG. 2, any suitable semiconductor material is provided as a substrate. Foe example, a single crystal substrate 20 with a <100> crystallographic orientation is used for the preferred embodiment. In this embodiment, the substrate 20 is provided with P conductive type ions. The substrate 20 is masked and is diffused in it N conductive type dopant, such as phosphorus, to form N+ buried layer 22 with a dopant concentration after drive-in of approximately 10E19 to 10E20 atoms/cm$^3$. Arsenic may be used instead of phosphorus. A P-epitaxial layer 24, having 30–60 ohm-cm, is then formed on the surface of the P substrate 20 to have a thickness of about 4.5 micron meters. The N-well and P-well are respectively formed in the epitaxial layer 24 by implantation and thermally diffusion. As depicted in the drawing, the P-well over the N+ buried layer 22 is surrounded by N-wells. Thus, the P-well is isolated by the N-wells and the N+ buried layer 22, as shown in FIG. 3.

Figure 4:
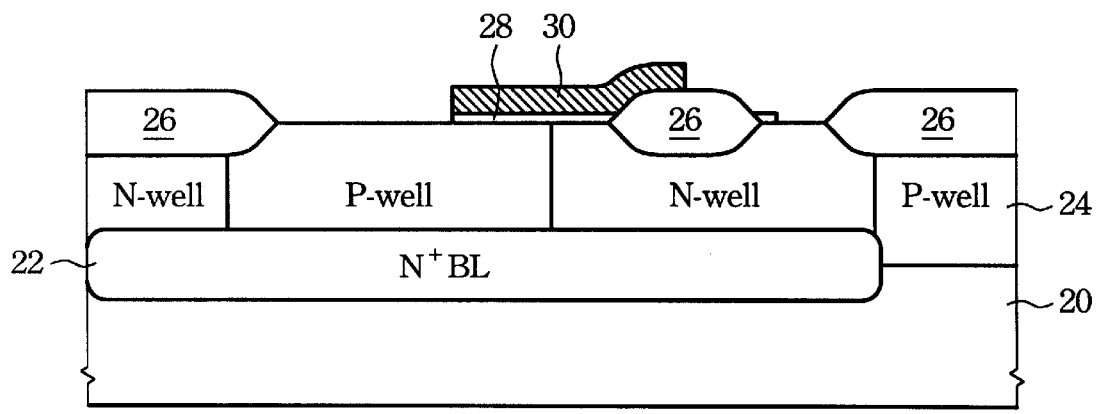
FIG. 4 is a cross sectional view of a semiconductor substrate illustrating the step of forming field oxide regions and gate structure on the semiconductor substrate according to the present invention.

Turning to FIG. 4, a plurality of isolation structure such as field oxide (FOX) regions 26 are created for the purposes of defining the active area. Typically, the FOX regions 24 are created via a photoresist and dry etching to define a silicon nitride-silicon dioxide composite layer. After the photoresist is removed and wet clean process, thermal oxidation in an oxygen ambient is performed to form the FOX regions 26, to a thickness of about 3000–8000 angstroms. The silicon nitride layer is then typically removed using hot phosphoric acid solution while the silicon dioxide is removed by using diluted HF or BOE solution.

Subsequently, a thin oxide layer 28 is formed on the epitaxial layer 24 to act as a gate dielectric. In an embodiment, the gate dielectric layer 28 is composed of silicon oxide that is formed by using an oxygen-steam ambient, at a temperature between about 800 to 1100 degrees centigrade. Alternatively, the gate oxide 28 may be formed using other known oxide chemical compositions and procedures. For example, the gate oxide layer 28 can be silicon dioxide formed using a chemical vapor deposition process, with a tetraethylorthosilicate (TEOS) source, at a temperature between about 600 to 800 degrees centigrade and a pressure of about 0.1 to 10 torr. In a case, the thickness of the gate oxide layer 28 is about 15–200 angstroms.

Referring to FIG. 4, after the gate dielectric layer 28 is formed. A doped polysilicon layers 30 is deposited by chemical vapor deposition on the gate oxide layer 28. Then, the doped polysilicon layer 30, and the gate dielectric layer 28 are patterned to form gate structures on the P-well and N-well. The dielectric layer 28 uncovered by the gate 30 is removed. A N+ drain contact 32 in the drain (N-well) and a source region in the P-well over the N+ buried layer are formed by conventional manner. The source region of the device is consisted of a P type doped region and on N type doped region. The P type doped region is adjacent to the N type doped region, as shown in FIG. 5. An isolation is formed on the structure, followed by etching the isolation layer to isolate the gate 30.

As is understood by a person skilled in the art, the foregoing embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A structure of HVNMOS on a substrate with P conductive type ions, the structure comprising:

a buried layer with N type ions in said substrate and adjacent to a surface of said substrate;

an epitaxial layer on said buried layer;

a P-well in said epitaxial layer adjacent to a portion of said buried layer;

N-wells in said epitaxial layer and surrounding said P-well, thereby isolating said P-well by said N-wells adjacent to said P-well and said buried layer, said buried layer connecting to one of said N-well together serving as a drain;

a field oxide in said N-well serving as said drain to define an active area;

a gate oxide on a surface of said P-well and said N-well serving as said drain;

a gate on said gate oxide;

a drain contact in said N-well serving as said drain; and a source region consisted of a P type doped region and an N type doped region in said P-well, said P type doped region being adjacent to said N type doped region.

2. The structure of claim 1, further comprising an isolation layer on said gate for isolation.

3. The structure of claim 1, wherein said gate has a portion that lies on a portion of said field oxide on said drain.

4. The structure of claim 1, wherein a concentration of dopants of said buried layer is about 10E19 to 10E20 atoms/cm$^3$.

5. The structure of claim 1, further comprising a channel region located within said P-well under said gate oxide.

6. The structure of claim 1, wherein said buried layer comprises arsenic.

7. The structure of claim 1, wherein said buried layer comprises phosphorus.

* * * * *